United States Patent
Hao et al.

(10) Patent No.: US 10,598,995 B2
(45) Date of Patent: Mar. 24, 2020

(54) ARRAY SUBSTRATE, FABRICATION METHOD, AND CORRESPONDING DISPLAY PANEL AND ELECTRONIC DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jingang Hao, Beijing (CN); Dongkun Wu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 136 days.

(21) Appl. No.: 15/308,643

(22) PCT Filed: Jan. 26, 2016

(86) PCT No.: PCT/CN2016/072168
§ 371 (c)(1),
(2) Date: Nov. 3, 2016

(87) PCT Pub. No.: WO2017/054381
PCT Pub. Date: Apr. 6, 2017

(65) Prior Publication Data
US 2017/0269444 A1    Sep. 21, 2017

(30) Foreign Application Priority Data
Sep. 28, 2015 (CN) .......................... 2015 1 0627008

(51) Int. Cl.
*G02F 1/1362* (2006.01)
*H01L 23/60* (2006.01)
(Continued)

(52) U.S. Cl.
CPC ........ *G02F 1/136204* (2013.01); *H01L 23/60* (2013.01); *H01L 27/0248* (2013.01); *H01L 27/1244* (2013.01); *G02F 1/136286* (2013.01)

(58) Field of Classification Search
CPC ............. H01L 27/3272; H01L 27/0292; H01L 27/0288; H01L 27/0248; H01L 23/60;
(Continued)

(56) References Cited

U.S. PATENT DOCUMENTS 7,199,846 B2 * 4/2007 Lim .................... G02F 1/13458
349/38
9,013,648 B1 * 4/2015 Xu .................... G02F 1/136204
349/41
(Continued)

FOREIGN PATENT DOCUMENTS

CN    1350326 A    6/2002
CN    1452002 A    10/2003
(Continued)

OTHER PUBLICATIONS

Search Report and Written Opinion dated Jul. 5, 2016 from State Intellectual Property Office of the P.R. China.
(Continued)

*Primary Examiner* — Amar Movva
(74) *Attorney, Agent, or Firm* — Dilworth & Barrese, LLP; Michael J. Musella, Esq.

(57) ABSTRACT

An array substrate (200), a fabrication method of the array substrate (200), and a display panel and an electronic device having the array substrate (200) are provided. The array substrate (200) includes a base substrate (201), and a gate line (202), an insulating layer (204), a data line (208), and a first active pad layer (216) provided on the base substrate (201); wherein, the insulating layer (204) is provided on the gate line (202), the data line (208) is arranged on the gate
(Continued)

line (202) through the insulating layer (204) and is arranged intersecting with the gate line (202), the first active pad layer (216) is arranged on the gate line (202) through the insulating layer (204) and is arranged overlapping with the gate line (202), and the first active pad layer (216) is arranged outside a region where the gate line (202) and the data line (208) overlap with each other.

16 Claims, 7 Drawing Sheets

(51) Int. Cl.
  *H01L 27/02* (2006.01)
  *H01L 27/12* (2006.01)
(58) Field of Classification Search
  CPC ..... G02F 1/136204; G02F 2001/13629; G02F 2001/136295
  See application file for complete search history.

(56) References Cited

U.S. PATENT DOCUMENTS

| 2003/0193626 | A1* | 10/2003 | Lim | G02F 1/13458 |
| | | | | 349/43 |
| 2005/0078232 | A1 | 4/2005 | Lo et al. | |
| 2008/0079887 | A1 | 4/2008 | Liu | |
| 2008/0174238 | A1* | 7/2008 | Jeong | H01L 27/3276 |
| | | | | 313/504 |
| 2010/0123869 | A1 | 5/2010 | Itakura et al. | |
| 2010/0244025 | A1 | 9/2010 | Liou | |
| 2012/0119979 | A1 | 5/2012 | Nakayasu | |
| 2013/0148049 | A1 | 6/2013 | Abe et al. | |
| 2014/0022500 | A1 | 1/2014 | Watanabe et al. | |

FOREIGN PATENT DOCUMENTS

| CN | 101158762 A | 4/2008 |
| CN | 101655759 | 2/2010 |
| CN | 102238959 A | 11/2011 |
| CN | 102338959 A | 2/2012 |
| CN | 103034003 A | 4/2013 |
| CN | 103500741 A | 1/2014 |
| CN | 103809341 A | 5/2014 |
| CN | 104317089 A | 1/2015 |
| CN | 105093762 A | 11/2015 |
| CN | 204925573 U | 12/2015 |
| JP | 2000098425 A | 4/2000 |
| JP | 2005051193 A | 2/2005 |
| JP | 2005316002 A | 11/2005 |
| JP | 2008053517 A | 3/2006 |
| JP | 2008176256 A | 7/2008 |
| KR | 100436181 B1 | 6/2004 |

OTHER PUBLICATIONS

Chinese Office Action dated Aug. 1, 2017.
Second Chinese Office Action dated Oct. 9, 2017.
Fourth Chinese Office Action dated Sep. 17, 2018.
Extended European Search Report dated May 14, 2019.
Third Korean Office Action dated Feb. 18, 2019.
Japanese Office Action dated Nov. 11, 2019.

* cited by examiner

ARRAY SUBSTRATE, FABRICATION METHOD, AND CORRESPONDING DISPLAY PANEL AND ELECTRONIC DEVICE

TECHNICAL FIELD

Embodiments of the present disclosure relate to an array substrate, a fabrication method, and a corresponding display panel and an electronic device.

BACKGROUND

A structure of an array substrate comprises a base substrate and a gate line, an insulating layer and a data line provided on the base substrate. The gate line provides a scanning signal from a gate electrode driving circuit, while the data line provides a data signal from a data drive. During a process of fabricating the array substrate, when the base substrate and an array device are in friction with each other or operate in a vacuum wall, charges accumulate on a surface of the base substrate, so as to form static electricity. When the charges accumulate to a certain extent, discharge, that is, Electro Static Discharge (ESD) occurs. ESD will damage a film layer already formed on the base substrate, resulting in short circuit between different film layers, causing a defect. Short circuit caused by ESD will result in a split screen and full screen stripes produced in a display panel fabricated, which is one of conventional defects in the fabrication process of the array substrate.

SUMMARY

At least one embodiment of the present disclosure provides an array substrate, a fabrication method of the array substrate, and a display panel and an electronic device having the array substrate, to reduce probability of occurrence of short circuit due to electro static discharge between the gate line and the data line.

At least one embodiment of the present disclosure provides an array substrate, comprising: a base substrate, and a gate line, an insulating layer, a data line, and a first active pad layer provided on the base substrate; wherein, the insulating layer is provided on the gate line, the data line is arranged on the gate line through the insulating layer and is arranged intersecting with the gate line, the first active pad layer is arranged on the gate line through the insulating layer and is arranged overlapping with the gate line, and the first active pad layer is arranged outside a region where the gate line and the data line overlap with each other.

For example, the first active pad layer may have an irregular shape.

For example, the first active pad layer may have a tip structure.

For example, an edge of a part of the gate line overlapping with the first active pad layer may form a tip structure.

For example, the array substrate may further comprise a data line pad layer, wherein, the data line pad layer is provided on the first active pad layer and overlaps with the first active pad layer.

For example, the data line pad layer may be electrically insulated from the data line.

For example, the data line pad layer may have a serrate edge.

For example, the array substrate may further comprise a second active pad layer, wherein, the second active pad layer is provided on the insulating layer and is located in a region where the gate line and the data line overlap with each other.

For example, the array substrate may further comprise at least one of the first active pad layers.

At least one embodiment of the present disclosure provides a fabrication method of an array substrate, the array substrate comprising a base substrate, and a gate line, an insulating layer, a data line, and an active pad layer provided on the base substrate, the fabrication method comprising: providing the insulating layer on the gate line, arranging the data line on the gate line through the insulating layer and intersecting with the gate line, arranging the active pad layer on the gate line through the insulating layer and overlapping with the gate line, and arranging the active pad layer outside a region where the gate line and the data line overlap with each other.

At least one embodiment of the present disclosure provides a display panel having the above-described array substrate.

At least one embodiment of the present disclosure provides an electronic device having the above-described array substrate.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

FIG. 1b is a cross-sectional schematic diagram along a line AA in FIG. 1a;

FIG. 3b is a cross-sectional schematic diagram along a line DD in FIG. 3a;

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1A:
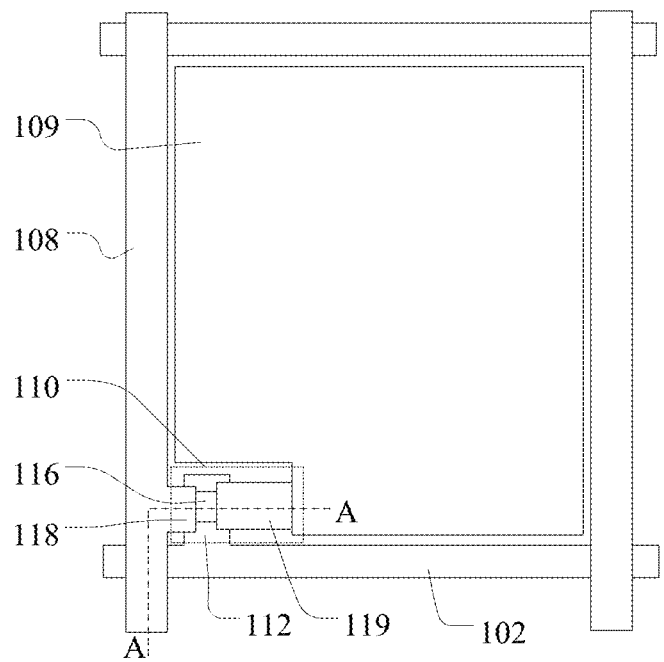
FIG. 1a is a top-view schematic diagram of a sub-pixel unit of an array substrate.

With an array substrate used in a liquid crystal display panel as an example, as illustrated in FIG. 1a, the array substrate generally comprises a plurality of gate lines 102 and a plurality of data lines 108; these gate lines 102 and data lines 108 intersect with each other so as to define sub-pixel units arrayed in matrix (only one sub-pixel unit is specifically illustrated in FIG. 1a); and each sub-pixel unit includes a thin film transistor 110 used as a switching element and a pixel electrode 109 used for controlling arrangement of liquid crystals. For example, according to needs, in an array substrate of a liquid crystal display panel of an IPS type or an ADS type, each sub-pixel unit may further include a common electrode in cooperation with the pixel electrode to form an electric field for driving liquid crystal molecules. For example, in each sub-pixel unit, a gate electrode 112 of the thin film transistor 110 is electrically connected (e.g., integrally formed) with a corresponding gate line 102, a source electrode 118 is electrically connected (e.g., integrally formed) with a corresponding data line 108, and a drain electrode 119 is electrically connected (e.g., integrally formed) with a corresponding pixel electrode 109.

Figure 1B:
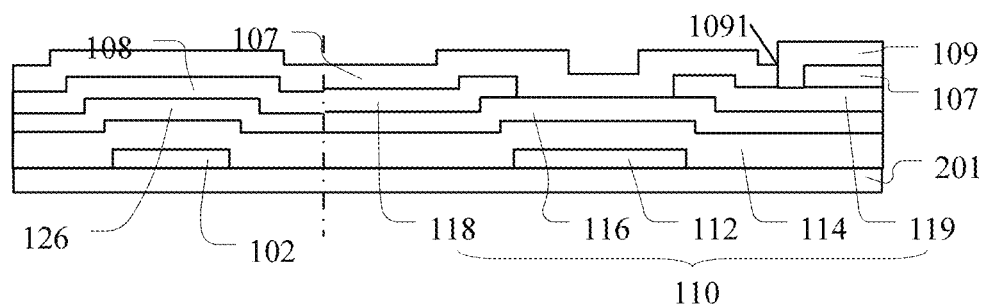

FIG. 1b is a cross-sectional schematic diagram along a line AA in FIG. 1a. As illustrated in FIG. 1b, for example, the thin film transistor 110 in the array substrate includes, the gate electrode 112, a gate insulating layer 114 provided on the gate electrode 112, an active layer 116 provided on the gate insulating layer 114, and a source electrode 118 and a drain electrode 119 provided on the active layer 116 and electrically connected therewith, respectively; and the pixel electrode 109, for example, may be electrically connected with the drain electrode 119 through a via hole 1091 in a passivation layer 107.

The array substrate illustrated in FIG. 1b may comprise, for example, steps S01 to S04 described as follows.

Step S01: forming a gate metal layer thin film on a base substrate 101, and fabricating a gate metal layer including the gate electrode 112 and the gate line 102 by a single patterning process.

Step S02: forming a gate insulating layer 114 on the gate metal layer.

Step S03: forming an active layer thin film on the gate insulating layer 114, and forming the active layer 116 by a single patterning process.

Step S04: forming the source-drain metal layer thin film on the active layer 116, and forming a source-drain metal layer including the source electrode 118, the drain electrode 119, and the data line 108 by a single patterning process.

Step S05: forming the passivation layer 107 and the via hole 1091 located in the passivation layer 107 on the source-drain metal layer by a single patterning process.

Step S06: forming the pixel electrode 109 on the passivation layer 107 by a single patterning process, the pixel electrode 109 being electrically connected with the drain electrode 119 through the via hole 1091 in the passivation layer 107.

Figure 1C:
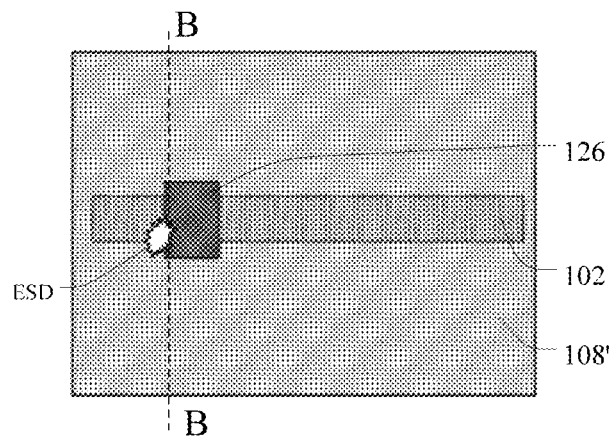
FIG. 1c is a top-view schematic diagram of forming a source-drain metal layer thin film on an active pad layer.
Figure 1D:
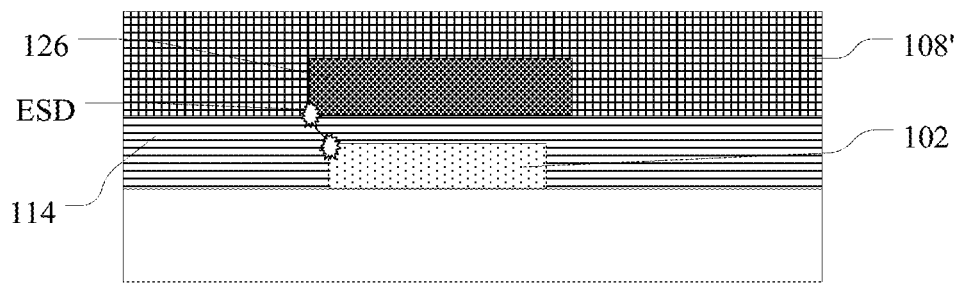
FIG. 1d is a cross-sectional schematic diagram along a line BB in FIG. 1c.

In research, inventors of the present application noticed problems below. At present, wires of the display panel mainly include the gate line 102 in the gate metal layer and the data line 108 in the source-drain metal layer, which two layers of wires transmit different signals so that no short circuit should occurs between the two. However, affected by remaining techniques of four times of patterning process (in the four times of patterning process, step S03 and step S04 as described above are merged into a same patterning process), in step S03, as illustrated in FIG. 1b, while the active layer 116 is being formed, the active pad layer 126 is formed below the data line 108 (a remaining part of the active layer thin film), and the active pad layer 126 includes a part where the gate line and the data line intersect with each other. As illustrated in FIG. 1c and FIG. 1d, the source-drain metal layer thin film 108' is formed on the active pad layer 126, electrostatic charges may accumulate during the fabrication process; since these electrostatic charges may move randomly along the source-drain metal layer thin film 108' on the entire base substrate 101, if there is a tip at a part where an edge of the active pad layer 126 contacts the insulating layer 114, the charges tends to accumulate at the tip, which easily leads to a phenomenon of electro static discharge in a part where the gate line 102 and the data line 108 intersect with each other, so that the gate line 102 and the data line 108 may be conducted to each other, resulting in short circuit.

The embodiments of the present disclosure, by providing the first active pad layer which has a part overlapping with the gate line and is located outside the region where the gate line and the data line overlap with each other, can reduce probability of occurrence of electro static discharge between the gate line and the data line, so as to reduce probability of occurrence of short circuit between the gate line and the data line due to ESD.

Figure 2A:
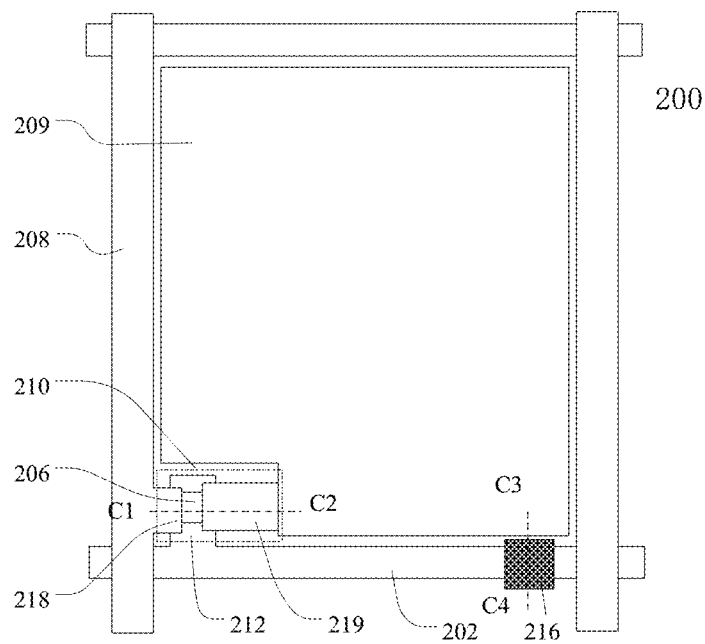
FIG. 2a is a top-view schematic diagram of an array substrate provided by an embodiment of the present disclosure.
Figure 2B:
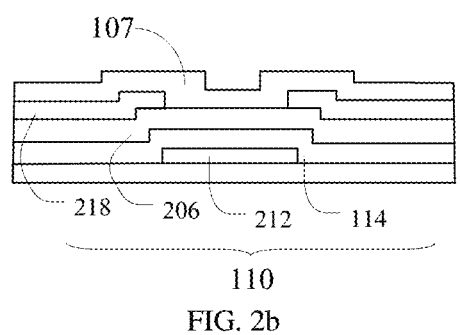
FIG. 2b is a cross-sectional schematic diagram of the array substrate of FIG. 2a along a line C1-C2.
Figure 2C:
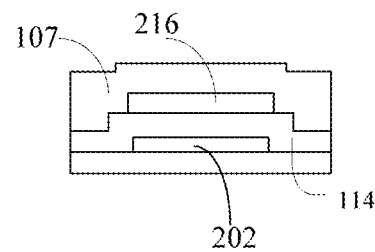
FIG. 2c is a cross-sectional schematic diagram of the array substrate of FIG. 2a along a line C3-C4.

FIG. 2a to FIG. 3d illustrate an array substrate 200 provided by at least one embodiment of the present disclosure. Therein, FIG. 2a is a top-view schematic diagram of the array substrate provided by the embodiment of the present disclosure, FIG. 2b is a cross-sectional schematic diagram of the array substrate of FIG. 2a along a line C1-C2; and FIG. 2c is a cross-sectional schematic diagram of the array substrate 200 of FIG. 2a along a line C3-C4. As illustrated in FIG. 3a, the array substrate 200 comprises: a base substrate 201, and a gate line 202 provided on the base substrate 201, an insulating layer 204 provided on the gate line 202, a data line 208, which is arranged on the gate line 202 through the insulating layer 204 and is arranged intersecting with the gate line 202, and a first active pad layer 216, which is arranged on the gate line 202 through the insulating layer 204 and is arranged overlapping with the gate line 202, and the first active pad layer 216 being arranged outside a region where the gate line 202 and the data line 208 overlap with each other.

Figure 3A:
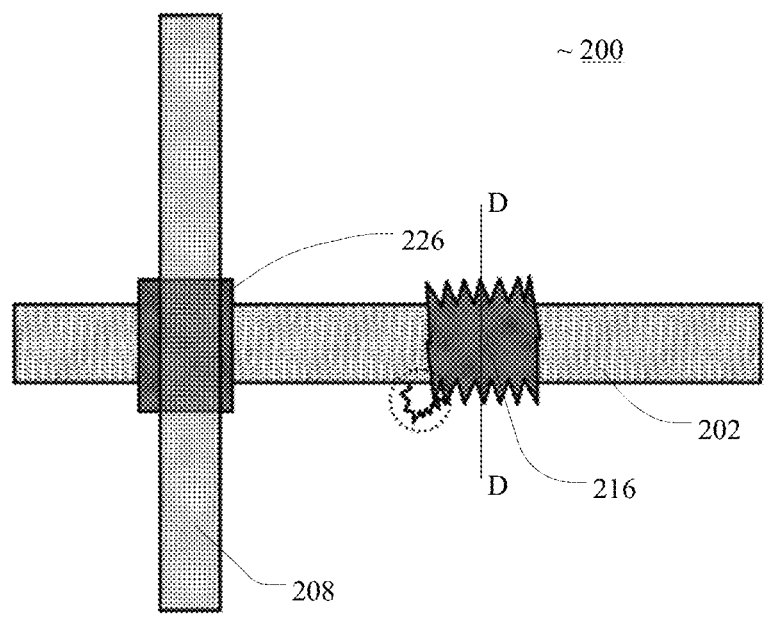
FIG. 3a is a top-view schematic diagram of the array substrate provided by an embodiment of the present disclosure.
Figure 3B:
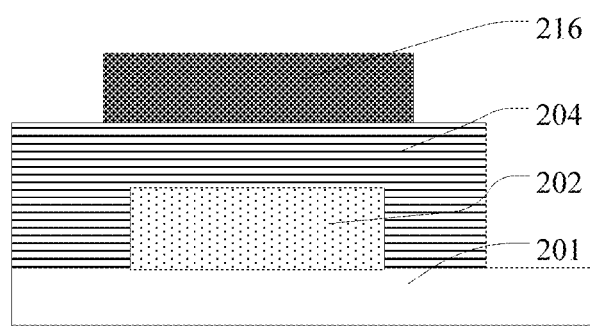

In the present disclosure, as illustrated in FIG. 3b, that the first active pad layer 216 and the gate line 202 overlap with each other refers to that orthographic projections of the two structures, on a plane where the base substrate is located, have an overlapping part.

For example, in one embodiment, in addition to the first active pad layer 216, the array substrate 200 may further comprise a second active pad layer 226. In a direction perpendicular to the plane where the base substrate is located, the second active pad layer 226 is provided between the insulating layer 204 and the data line 208 and is located within the region where the gate line 202 and the data line 208 overlap with each other. As compared with a case illustrated in FIG. 1c, the array substrate provided by the embodiment of the present disclosure may comprise two types of active pad layers, i.e., respectively, the first active pad layer 216 provided in the embodiment of the present disclosure and the second active pad layer 226 remained, for example, due to the remaining techniques of the four times of patterning process. In a process of preparing the source electrode, the drain electrode and the data line, static electricity accumulates in the previous process can randomly migrate long the source-drain metal layer thin film used for forming the source electrode, the drain electrode and the data line, so before the source electrode, the drain electrode and the data line are formed by a patterning process, probabilities for static electricity to accumulate on the two types of active pad layers are the same. Thus, the first active pad layer 216 shares probability of occurrence of ESD on the second active pad layer 226. That is, by providing the first active pad layer 216, the probability of occurrence of ESD on the second active pad layer 226 between the gate line 202 and the data line 208 is reduced, so that probability of occurrence of short circuit between the gate line 202 and the data line 208 due to the occurrence of ESD may be reduced.

Figure 3C:
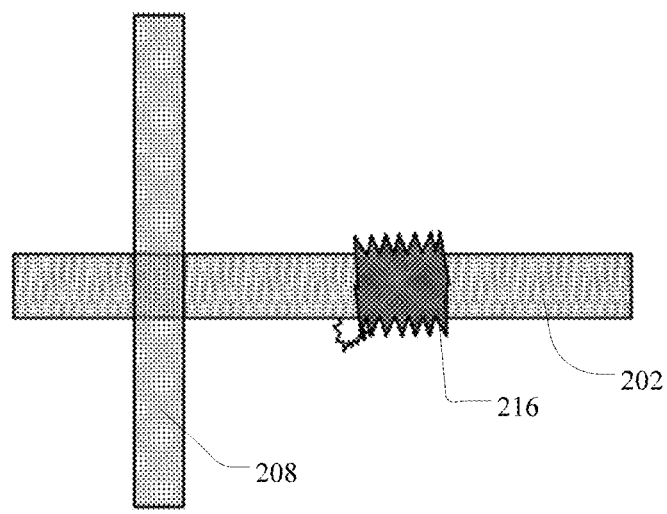
FIG. 3c is a top-view schematic diagram of the array substrate that does not comprise a second active pad layer provided by an embodiment of the present disclosure.

For example, as illustrated in FIG. 3c, the array substrate 200 may also comprise only the first active pad layer 216, but not the second active pad layer 226. In this case, before the source-drain metal layer thin film which is electrically connected with the first active pad layer 216 is formed on the first active pad layer 216, and the source electrode, the drain electrode and the data line are formed by a patterning process, the first active pad layer 216 may provide a channel for electro static discharge for the array substrate, so as to reduce static electricity accumulation on the array substrate.

Exemplarily, the array substrate 200 may further comprise a thin film transistor 210, which includes an active layer 206, a drain electrode 219, and a source electrode 218. In addition, for example, in a direction perpendicular to the plane where the base substrate 201 is located, there is no insulating layer between the active layer 206 and the drain electrode 219, that is, the active layer 206 and the drain electrode 219 are not electrically connected through the via hole or any other conductive member. Thus, before the source electrode, the drain electrode and the data line are formed, the source-drain metal layer thin film is in direct contact with the first active pad layer, so static electricity can accumulate on the first active pad layer more easily, so as to reduce the probability of occurrence of ESD between the gate line and the data line. Embodiments of the present disclosure include, but are not limited thereto. For example, if after the active layer and the first active pad layer are formed and before the source-drain metal layer thin film is formed, another insulating layer is formed on the active layer and the first active pad layer, then it is only necessary to provide a via hole in a position where the insulating layer corresponds to the first active pad layer so as to expose a surface of the first active pad layer (so that it is electrically connected with the first active pad layer when the source-drain metal layer thin film is being formed).

Exemplarily, a planar shape of the first active pad layer 216 (i.e., a shape thereof on a plane where it is located) may be any shape, such as a circle, an oval, or a polygon (e.g., a triangle, a quadrangle), and the like.

Exemplarily, a planar shape of the first active pad layer 216 may have an irregular shape. For example, the first active pad layer 216 may have a serrate edge. Under action of a strong electric field, electric field strength surges in a part of a surface of an object where curvature is large (such as top of a sharp and small object), and discharge is more likely to occur, so the planar shape of the first active pad layer 216 is set to be an irregular shape, which may further increase probability for ESD to occur on the first active pad layer 216, that is, further reduce probability for ESD to occur on the second active pad layer 226.

Figure 3D:
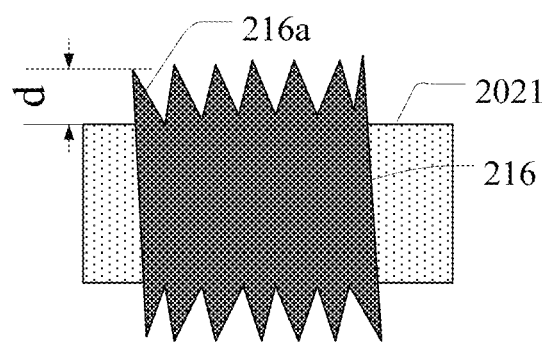
FIG. 3d is a partial enlarged schematic diagram of a first active pad layer and a gate line in the array substrate provided by an embodiment of the present disclosure.

Exemplarily, as illustrated in FIG. 3d, the first active pad layer 216 may have a tip structure 216a. Since electro static discharge typically occurs at the tip, by making the first active pad layer 216 to have the tip structure 216a, static electricity may be attracted to accumulate on the first active pad layer 216, so as to increase probability for ESD to occur on the first active pad layer 216.

Exemplarily, the tip structure 216a may extend in a direction along a plane where the first active pad layer 216 is located. For example, orthographic projection of top of the tip structure 216a on a plane where the gate line 202 is located may be located outside the gate line 202. For example, a distance d from the top of the tip structure 216a (an end far away from the middle of the first active pad layer 216) to an edge 2021 of the gate line 202 (the edge 2021 being located on a side where the tip structure 216a is located) may be less than or equal to 3 μm, and in this way, it is advantageous to further direct static electricity to be discharged from the tip structure to the gate line. For example, an angle of the top of the tip structure 216a may be set to be less than 90 degrees, which is also advantageous to further direct static electricity to be discharged from the tip structure to the gate line.

Figure 4A:
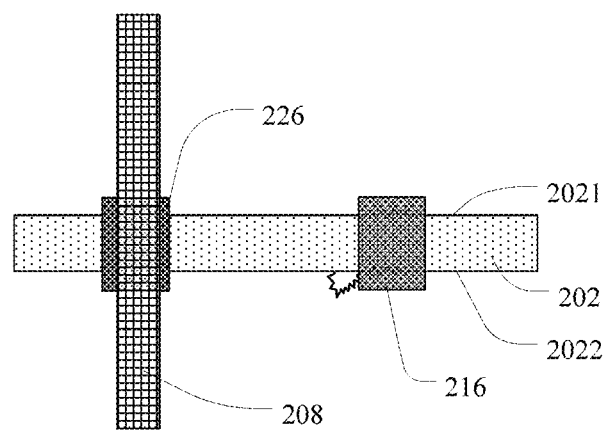
FIG. 4a and FIG. 4b are respectively top-view schematic diagrams of the gate line provided with a serrate edge in the array substrate provided by an embodiment of the present disclosure.
Figure 4B:
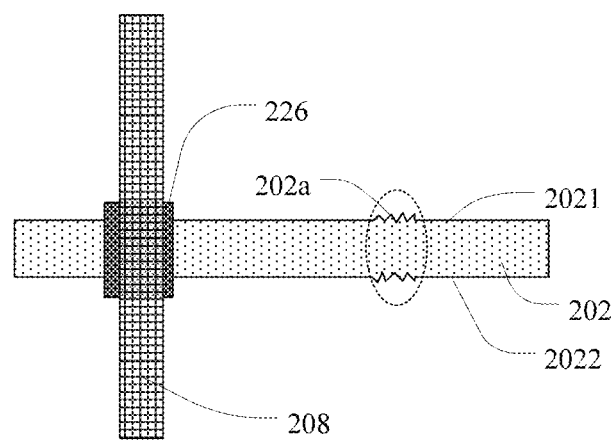

Exemplarily, as illustrated in FIG. 4a and FIG. 4b, at least one edge of a part of the gate line 202 where the gate line 202 and the first active pad layer 216 overlap with each other (as illustrated by a dashed box in FIG. 4b) (as illustrated with two edges as an example in the diagram) may also be formed to have the tip structure 202a. That is, at least one edge (e.g., two opposite edges 2021 and 2022) of the gate line 202 has a tip structure 202a in a position where the gate line 202 and the first active pad layer 216 overlap with each other. The tip structure 202a may be set with reference to the tip structure 216a of the first active pad layer as described above, which will not be repeated here.

In the above-described examples, by setting at least one of the edges of the first active pad layer 216 and of the part of the gate line 202 where the gate line 202 and the first active pad layer 216 overlap with each other to have the tip structure, the probability for ESD to occur on the second active pad layer 226 between the gate line and the data line may be further reduced.

Figure 5A:
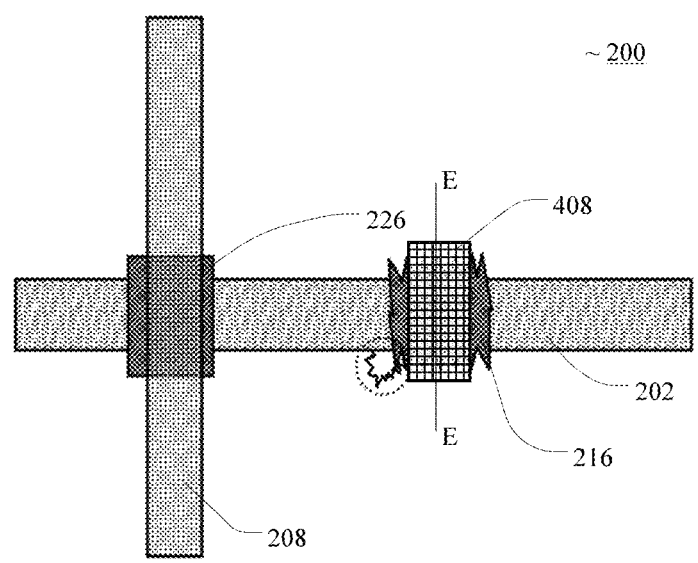
FIG. 5a is a top-view schematic diagram of the array substrate comprising a data line pad layer provided by an embodiment of the present disclosure.
Figure 5B:
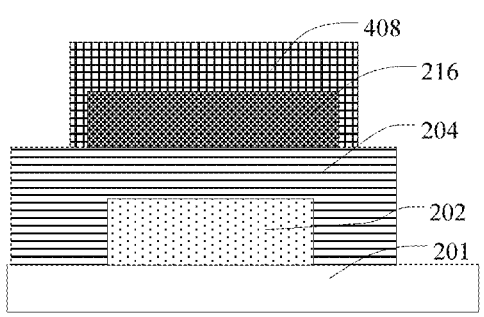
FIG. 5b is a cross-sectional schematic diagram along a line EE in FIG. 5a provided by the embodiment of the present disclosure.

Exemplarily, in another embodiment, with reference to FIG. 5a and FIG. 5b, the array substrate 200 may further comprise a data line pad layer 408, which is provided on the first active pad layer 216 and overlaps with the first active pad layer 216. This is advantageous to provide a channel for electro static discharge in subsequent steps. For example, after the source electrode, the drain electrode and the data line are formed, a pixel electrode thin film is formed on the source electrode, the drain electrode and the data line to form a pixel electrode, and after the pixel electrode thin film is formed and before the pixel electrode is formed, if the pixel electrode thin film is electrically connected with the data line pad layer, then the data line pad layer may attract static electricity on the pixel electrode thin film, to further reduce the probability for ESD to occur between the gate line and the data line. Of course, embodiments of the present disclosure include, but are not limited thereto.

The data line pad layer 408 and the data line 208 are formed on a same layer, that is, are formed by using a source-drain metal layer thin film. The data line pad layer 408 is made of a metallic material, such as Cu, Mo, Al, Cu alloy, Mo alloy, and Al alloy.

Exemplarily, the data line pad layer 408 is electrically insulated from the data line 208. In this way, even if a short-circuit phenomenon occurs between the gate line 202 and the data line pad layer 408 via the first active pad layer 216, normal operation of the sub-pixel unit will not be affected. Thus, this may further increase the probability for ESD to occur at the first active pad layer 216. That is to say, the probability for ESD to occur on the second active pad layer 226 between the gate line 202 and the data line 208 can be further reduced. Furthermore, the data line pad layer 408 is not electrically connected with any part of the pixel unit horizontally, for example.

The array substrate provided by the embodiment of the present disclosure, for example, may have the active layer, the source electrode, the drain electrode and the data line simultaneously formed by a single patterning process (for example, the array substrate is fabricated by four times of patterning process), in this case, the data line pad layer and the first active pad layer are formed by a same patterning process, and thus, orthographic projections of the two are substantially coincident on the plane where the base substrate is located, that is, edges of the two are substantially aligned.

Of course, the embodiment of the present disclosure may also be used in the array substrate having the active layer and the source-drain metal layer including the source electrode, the drain electrode and the data line formed respectively by different patterning processes. In this case, the data line pad layer and the first active pad layer are formed by different patterning processes, so that the orthographic projections of the two on the plane where the base substrate is located may not coincide, for example, the projection of one falls into the projection of the other, or the two partially overlap with each other.

For example, a planar shape of the data line pad layer 408 may be any shape, such as, for example, a circle, an oval, or a polygon (e.g., a triangle, a quadrangle), and the like.

For example, the data line pad layer 408 may be set to have a serrate edge, which is advantageous to further direct static electricity to be discharged from the tip structure to the data line pad layer 408.

Figure 6:
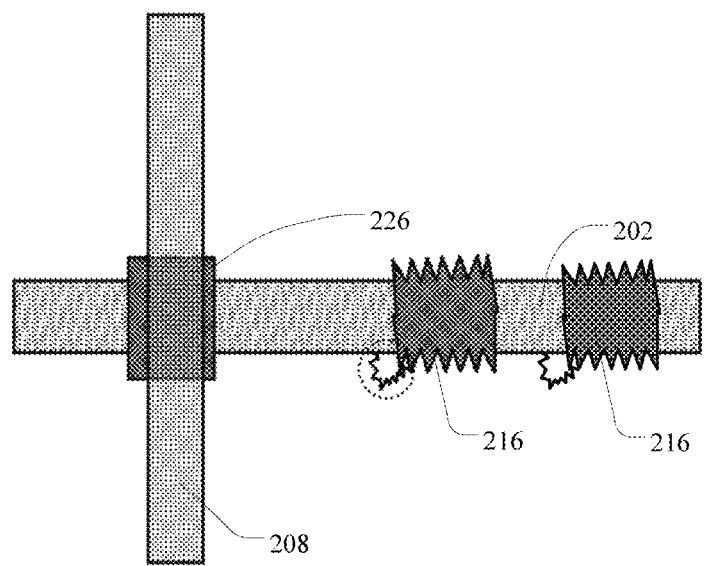
FIG. 6 is a top-view schematic diagram of an array substrate having a plurality of first active pad layers provided by the embodiment of the present disclosure.

Exemplarily, in another embodiment, in addition to the first active pad layer 216, the array substrate may further comprise at least one other first active pad layer. By setting another first active pad layer, i.e., setting a plurality of first active pad layers, the probability for ESD to occur on the second active pad layer between the gate line and the data line can be further reduced. For example, as illustrated in FIG. 6, the array substrate 200 comprises two first active pad layers 216. In this case, ESD may occur on both of the first active pad layers, and thus, the probability for ESD to occur on the second active pad layer between the gate line and the data line can be further reduced. It should be understood by those skilled in the art that the number of the first active pad layers in the embodiment of the present disclosure is not limited to two as illustrated in FIG. 5a and FIG. 5b, but a plurality of first active pad layers may be included.

The above-described array substrate may reduce the probability for ESD to occur on the second active pad layer between the gate line and the data line, so as to reduce probability of occurrence of short circuit between the gate line and the data line due to ESD.

In the array substrate provided by the embodiment of the present disclosure, the data line and the second active pad layer may be formed by a same patterning process; for example, the array substrate may by formed by four times of patterning process. In this case, the orthographic projections of the data line and the second active pad layer are substantially coincident on the plane where the base substrate is located, that is, the edges of the two are substantially aligned.

Of course, the embodiment of the present disclosure may also be used in the array substrate having the active layer and the source-drain metal layer including the source electrode, the drain electrode and the data line formed respectively by different patterning processes (for example, the array substrate is fabricated by five times or more of patterning process). In this case, the active layer and the source/drain electrodes of the thin film transistor are formed by different patterning processes, and accordingly, the data line and the second active pad layer located below it are also formed by different patterning processes, so that the orthographic projections of the two on the plane where the base substrate is located may not coincide.

Of course, the array substrate provided by the embodiment of the present disclosure may further comprise a pixel electrode 209, and the thin film transistor in the array substrate may further include a source electrode 218, as illustrated in FIG. 2.

An embodiment of the present disclosure further provides a fabrication method of an array substrate, the array substrate comprising a base substrate, and a gate line, an insulating layer, a data line, and a first active pad layer provided on the base substrate, the fabrication method comprising: providing the insulating layer on the gate line, arranging the data line on the gate line through the insulating layer and intersecting with the gate line, arranging the first active pad layer on the gate line through the insulating layer and overlapping with the gate line, and arranging the first active pad layer outside a region where the gate line and the data line overlap with each other.

Exemplarily, in another embodiment, the fabrication method may further comprise forming a data line pad layer, which is provided on the first active pad layer and overlaps with the first active pad layer. For example, the data line pad layer may be formed to be electrically insulated from the data line. For example, a shape of the data line pad layer may be a triangular, a quadrangle or a polygon. For example, the data line pad layer may be formed to have a serrate edge.

Exemplarily, in the fabrication method of the array substrate, the data line and the first active pad layer may be formed by different patterning processes, and in this case, the method may comprise steps S21 and S23 as follows.

Figure 7A:
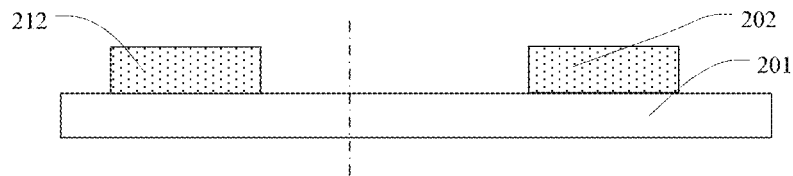
FIG. 7a to FIG. 7e are schematic diagrams of respective steps of fabricating an array substrate by using a fabrication method provided by an embodiment of the present disclosure.

Step S21: forming a gate metal layer including a gate line 202 on a base substrate 201 by a first time of patterning process, as illustrated in FIG. 7a.

For example, the gate metal layer thin film is formed on the base substrate 201 (e.g., a glass substrate, a plastic substrate, or a quartz substrate) by a sputtering process; and then, the gate line is formed by one time of exposure, development and wet etching process with a mask. For example, the gate metal layer may be made of an alloy of at least one or more metals such as Cr, Mo, Al, and Cu.

In this step, a gate electrode 212 may be further formed in the gate metal layer.

Figure 7B:
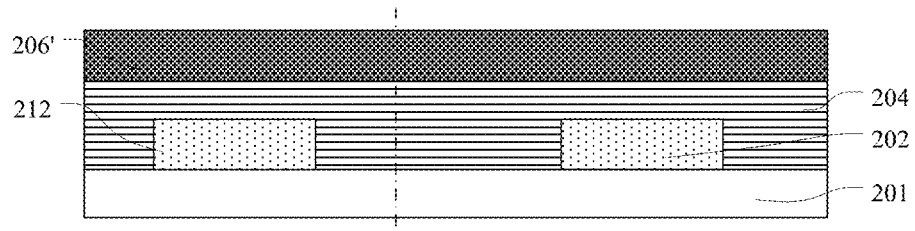
Figure 7C:
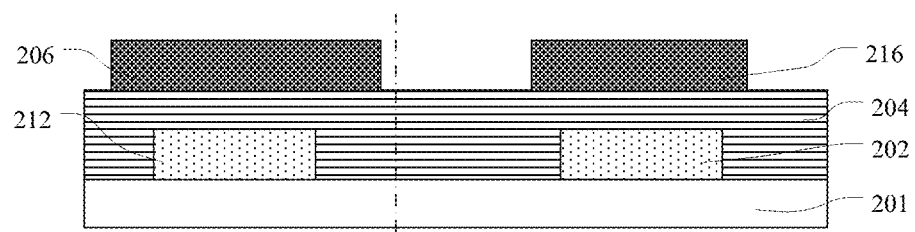

Step S22: forming an active layer thin film 206' on the gate line 202, as illustrated in FIG. 7b; and thereafter, forming an active layer 206 and a first active pad layer 216 by a second time of patterning process, as illustrated in FIG. 7c.

Figure 7D:
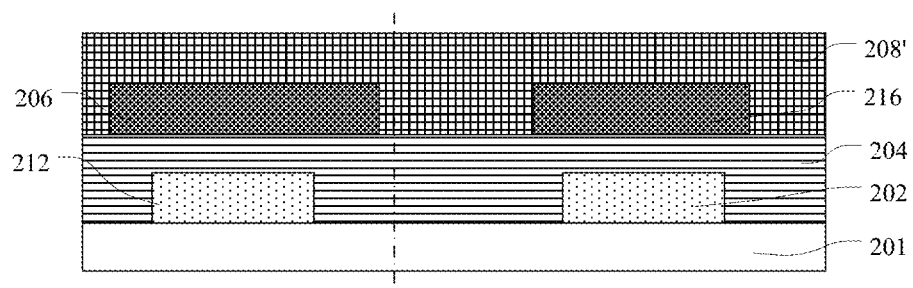
Figure 7E:
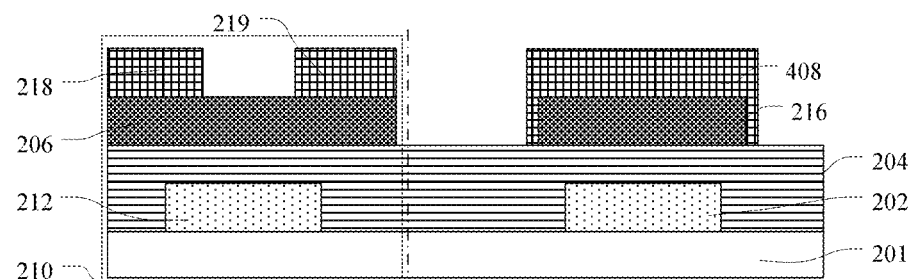

Step S23: forming a source-drain metal layer thin film 208' on the active layer 206 and the first active pad layer 216, as illustrated in FIG. 7d; and thereafter, forming a source electrode 218, a drain electrode 219 and the data line (not illustrated) by a third time of patterning process, as illustrated in FIG. 7e.

For example, in this step, a data line pad layer 408 may further be formed.

Exemplarily, a pattern of the first active pad layer may have an irregular shape. For example, a part of the first active pad layer corresponding to a gray-tone translucent mask may have an irregular shape, so that the first active pad layer may be formed to have an irregular shape.

Exemplarily, the first active pad layer may be formed to have a tip structure. For example, an angle of the tip structure may be formed to be less than 90 degrees. Further, for example, a distance from top of the tip structure to an edge of the gate line (the edge being located on a side where the tip structure is located) may be less than or equal to 3 μm.

Furthermore, in the first time of patterning process, an edge of the part of the gate line where the gate line and the first active pad layer overlap with each other may be formed to have a tip structure. That is to say, a part of the edge of the gate line may have a tip structure.

Exemplarily, the fabrication method may further comprise forming at least one other first active pad layer, i.e., forming a plurality of first active pad layers.

Of course, the fabrication method provided by at least one embodiment of the present disclosure further comprises: forming an insulating layer that insulates the gate line and the data line from each other; the insulating layer, for example, may be formed with the gate line by a same patterning process, or formed with the data line and the first active pad layer by a same patterning process, or the insulating layer may be formed after the first time of patterning process for forming the gate line and before the second time of patterning process. In the embodiment of the present disclosure, the above-described insulating layer is usually a gate insulating layer. It is not limited by the embodiment of the present disclosure.

By the above-described fabrication method, probability of occurrence of ESD between the gate line and the data line during the fabrication process is reduced, so that probability of occurrence of short circuit between the gate line and the data line due to ESD is reduced.

In addition, for an array substrate used in a liquid crystal display panel, for example, the fabrication method provided by the embodiment of the present disclosure may further comprise a patterning process for forming a pixel electrode. For example, after the patterning process for forming the data line and before the patterning process for forming the pixel electrode, a process for forming a passivation layer and a patterning process for the passivation layer may also be included.

At least one embodiment of the present disclosure provides a display panel comprising the above-described array substrate. By using the above-described array substrate, the display panel provided by the embodiment of the present disclosure can reduce short circuit between the gate line and the data line caused by ESD, and thereby can reduce probability of occurrence of a split screen and full screen stripes, and improve a yield of the display panel.

Figure 8:
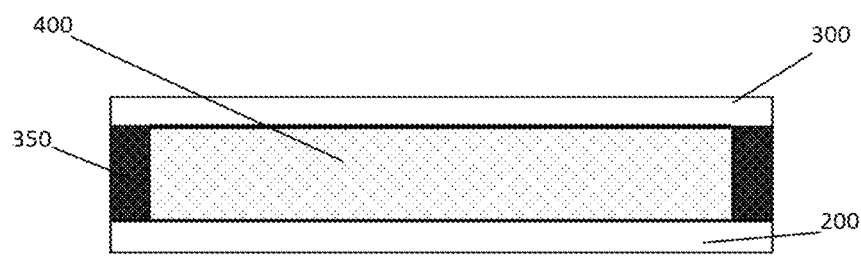
FIG. 8 is a cross-sectional schematic diagram of a display panel provided by an embodiment of the present disclosure.

For example, as illustrated in FIG. 8, the display panel according to the embodiment of the present disclosure may comprise an array substrate 200 and an opposed substrate 300, the array substrate 200 and the opposed substrate 300 being opposed to each other to form a liquid crystal box by sealant 350, and the liquid crystal box being filled with a liquid crystal material 400. The opposed substrate 300 is, for example, a color filter substrate. A pixel electrode of each pixel unit of the array substrate 200 is used for applying an electric field to control a degree of rotation of the liquid crystal material so as to perform display operation.

At least one embodiment of the present disclosure provides an electronic device comprising the above-described display panel. For example, the electronic device may comprise: a liquid crystal panel, E-paper, an OLED panel, a mobile phone, a tablet personal computer, a television, a monitor, a laptop, a digital photo frame, a navigator, a watch and any other product or component having a display function.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201510627008.5 filed on Sep. 28, 2015, the disclosure of which is incorporated herein by reference in its entirety as part of the present application.

The invention claimed is:

1. An array substrate, comprising: a base substrate, and a gate line, an insulating layer, a data line, a thin film transistor and a first active pad layer provided on the base substrate, wherein, the insulating layer is provided on the gate line, the data line is arranged on the gate line through the insulating layer and is arranged intersecting with the gate line, the first active pad layer is arranged on the gate line through the insulating layer and is arranged overlapping with the gate line, the first active pad layer and the gate line are separated by the insulating layer, the first active pad layer is arranged outside a region where the gate line and the data line overlap with each other, the thin film transistor comprises an active layer disposed on a side of the insulating layer away from the gate line and separated from the first active pad layer in a direction parallel to the base substrate, at least one of the first active pad layer and an edge of a part of the gate line where the gate line and the first active pad layer overlap with each other has a tip structure, wherein the tip structure comprises a serrated edge configured so that static electricity may be attracted to accumulate on the first active pad layer to increase the probability of electro static discharge.

2. The array substrate according to claim 1, wherein a planar shape of the first active pad layer has an irregular shape.

3. The array substrate according to claim 1, further comprising a data line pad layer and a pixel unit, wherein, the data line pad layer is provided on the first active pad layer and overlaps with the first active pad layer, the pixel unit is defined by the data line and the gate line crossing each other, the pixel unit comprises a pixel electrode, and the data line pad layer is not electrically connected with the pixel electrode horizontally.

4. The array substrate according to claim 3, wherein the data line pad layer is electrically insulated from the data line.

5. The array substrate according to claim 3, wherein the data line pad layer parallel to the base substrate has a serrate edge.

6. The array substrate according to claim 1, further comprising a second active pad layer, wherein, the second active pad layer is provided between the insulating layer and the data line, and is located in a region where the gate line and the data line overlap with each other.

7. The array substrate according to claim 1, further comprising at least one other first active pad layer, wherein the least one other first active pad layer is spaced apart from the first active pad layer in a direction parallel to the base substrate, and does not overlap with the first active pad layer in a direction perpendicular to the base substrate.

8. A display panel, comprising the array substrate according to claim 1.

9. A fabrication method of an array substrate, the array substrate comprising a base substrate, and a gate line, an insulating layer, a data line, a thin film transistor and a first active pad layer provided on the base substrate, the fabrication method comprising: forming the gate line on the base substrate, forming the insulating layer on the gate line, forming the thin film transistor on the insulating layer, arranging the data line on the gate line through the insulating layer and intersecting with the gate line, arranging the first active pad layer on the gate line through the insulating layer and overlapping with the gate line, wherein the first active pad layer and the gate line are separated by the insulating layer, and arranging the first active pad layer outside a region where the gate line and the data line overlap with each other, the thin film transistor comprises an active layer disposed on a side of the insulating layer away from the gate line and separated from the first active pad layer in a direction parallel to the base substrate, at least one of the first active pad layer and an edge of a part of the gate line where the gate line and the first active pad layer overlap with each other is formed to have a tip structure, wherein the tip structure comprises a serrated edge configured so that static electricity may be attracted to accumulate on the first active pad layer to increase the probability of electro static discharge.

10. The fabrication method of the array substrate according to claim 9, wherein the first active pad layer is formed to have an irregular shape in a plan view.

11. The fabrication method of the array substrate according to claim 9, further comprising forming a data line pad layer and a pixel unit, wherein, the data line pad layer is provided on the first active pad layer and overlaps with the first active pad layer, the pixel unit is defined by the data line and the gate line crossing each other, the pixel unit comprises a pixel electrode, and the data line pad layer is not electrically connected with the pixel electrode horizontally.

12. The fabrication method of the array substrate according to claim 11, wherein the data line pad layer is formed to be electrically insulated from the data line.

13. The fabrication method of the array substrate according to claim 11, wherein the data line pad layer is formed to have a serrate edge.

14. The fabrication method of the array substrate according to claim 9, further comprising forming a second active pad layer, wherein, the second active pad layer is provided between the insulating layer and the data line, and is located in a region where the gate line and the data line overlap with each other.

15. The fabrication method of the array substrate according to claim 9, further comprising forming at least one other first active pad layer, wherein the least one other first active pad layer is spaced apart from the first active pad layer in a direction parallel to the base substrate, and does not overlap with the first active pad layer in a direction perpendicular to the base substrate.

16. An electronic device, comprising the display panel according to claim 8.

* * * * *